US012356825B2

(12) United States Patent
Kim et al.

(10) Patent No.: US 12,356,825 B2
(45) Date of Patent: Jul. 8, 2025

(54) DISPLAY APPARATUS REALIZING A NARROW VIEWING ANGLE

(71) Applicant: LG Display Co., Ltd., Seoul (KR)

(72) Inventors: Sung Woo Kim, Seoul (KR); Young Bok Lee, Paju-si (KR); Ju Hoon Jang, Paju-si (KR); A Ra Yoon, Seoul (KR); Dong Yeon Kim, Seoul (KR); Hoon Kang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 850 days.

(21) Appl. No.: 17/539,638

(22) Filed: Dec. 1, 2021

(65) Prior Publication Data

US 2022/0199715 A1 Jun. 23, 2022

(30) Foreign Application Priority Data

Dec. 18, 2020 (KR) ........................ 10-2020-0178238

(51) Int. Cl.
| | |
|---|---|
| H10K 59/38 | (2023.01) |
| H10K 50/84 | (2023.01) |
| H10K 50/858 | (2023.01) |
| H10K 50/86 | (2023.01) |
| H10K 59/12 | (2023.01) |
| H10K 59/122 | (2023.01) |
| H10K 59/40 | (2023.01) |
| H10K 59/80 | (2023.01) |

(52) U.S. Cl.
CPC ............ *H10K 59/38* (2023.02); *H10K 50/84* (2023.02); *H10K 50/858* (2023.02); *H10K 50/865* (2023.02); *H10K 59/12* (2023.02); *H10K 59/122* (2023.02); *H10K 59/40* (2023.02); *H10K 59/8722* (2023.02); *H10K 59/879* (2023.02); *H10K 59/8792* (2023.02)

(58) Field of Classification Search
CPC ....................................................... H10K 59/122
See application file for complete search history.

(56) References Cited

U.S. PATENT DOCUMENTS

| | | | |
|---|---|---|---|
| 6,556,264 B1 * | 4/2003 | Hirakata | ........... G02F 1/136209 349/110 |
| 10,510,810 B2 | 12/2019 | Kim et al. | |

(Continued)

FOREIGN PATENT DOCUMENTS

| | | |
|---|---|---|
| JP | 2011-059621 A | 3/2011 |
| JP | 2012-146497 A | 8/2012 |

(Continued)

OTHER PUBLICATIONS

Korean Intellectual Property Office, Office Action, Korean Patent Application No. 10-2020-0178238, Jul. 3, 2024, 13 pages.

*Primary Examiner* — Ajay Ojha
*Assistant Examiner* — Hajar Kolahdouzan
(74) *Attorney, Agent, or Firm* — Fenwick & West LLP

(57) ABSTRACT

A display apparatus realizing a narrow viewing angle is provided. The display apparatus may include a light-emitting device on an emission region of a device substrate. A touch structure and a lens may be disposed on an encapsulating element covering the light-emitting device. The lens may be disposed on the emission region. A color filter may be disposed on the touch structure and the lens. Thus, in the display apparatus, Moire phenomenon may be prevented or at least reduced.

12 Claims, 7 Drawing Sheets

(56) References Cited

U.S. PATENT DOCUMENTS

| | | | |
|---|---|---|---|
| 10,553,827 | B2 | 2/2020 | Jang et al. |
| 11,075,364 | B2 | 7/2021 | Kim et al. |
| 11,139,346 | B2 | 10/2021 | Kim et al. |
| 11,711,959 | B2 | 7/2023 | Kim et al. |
| 2011/0062476 | A1 | 3/2011 | Tobise |
| 2018/0197921 | A1 | 7/2018 | Kim et al. |
| 2019/0221779 | A1* | 7/2019 | Jang ................. G06F 3/0412 |
| 2019/0371866 | A1 | 12/2019 | Kim et al. |
| 2020/0119113 | A1* | 4/2020 | Lee ................... H10K 50/11 |
| 2020/0168844 | A1 | 5/2020 | Kim et al. |
| 2021/0408138 | A1 | 12/2021 | Kim et al. |
| 2024/0379911 | A1* | 11/2024 | Ko .................... H01L 25/167 |

FOREIGN PATENT DOCUMENTS

| | | |
|---|---|---|
| KR | 10-2005-0087284 A | 8/2005 |
| KR | 10-2011-0074312 A | 6/2011 |
| KR | 10-2018-0082661 A | 7/2018 |
| KR | 10-2019-0086605 A | 7/2019 |
| KR | 10-2019-0124191 A | 11/2019 |
| KR | 10-2019-0135778 A | 12/2019 |
| KR | 10-2020-0063591 A | 6/2020 |

* cited by examiner

DISPLAY APPARATUS REALIZING A NARROW VIEWING ANGLE

CROSS-REFERENCE TO RELATED APPLICATION

This application claims the benefit of Republic of Korea Patent Application No. 10-2020-0178238 filed on Dec. 18, 2020, which is hereby incorporated by reference in its entirety.

BACKGROUND OF THE INVENTION

Field of the Invention

The present disclosure relates to a display apparatus realizing a narrow viewing angle using a touch structure.

Discussion of the Related Art

Generally, an electronic appliance, such as a monitor, a television (TV), a laptop computer, and a digital camera, includes a display apparatus capable of realizing an image. For example, the display apparatus may include light-emitting devices. Each of the light-emitting devices may emit light displaying a specific color. For example, each of the light-emitting devices may include a light-emitting layer disposed between a first emission electrode and a second emission electrode.

The display apparatus may realize the narrow viewing angle so that the image provided to user is not recognized by other people around the user for privacy reasons. For example, the display apparatus may restrict a travelling direction of the light emitted from each light-emitting device by using a light control film (LCF) including a light-blocking pattern. However, in the display apparatus, moire phenomenon may occur due to the light-blocking pattern. Thus, in the display apparatus, the quality of the image may be decreased.

SUMMARY

Accordingly, the present disclosure is directed to a display apparatus that substantially obviates one or more problems due to limitations and disadvantages of the related art.

An object of the present disclosure is to provide a display apparatus capable of realizing the narrow viewing angle and preventing the moire phenomenon.

Another object of the present disclosure is to provide a display apparatus to improving the frontal luminance of each emission region.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a device substrate. A bank insulating layer is disposed on the device substrate. The bank insulating layer defines a first emission region of the device substrate. A light-emitting device is disposed on the first emission region of the device substrate. The light-emitting device includes a first emission electrode, a light-emitting layer and a second emission electrode, that are sequentially stacked. An encapsulating element is disposed on the bank insulating layer and the light-emitting device. A touch structure, an optical element and a color filter are disposed on the encapsulating element. The touch structure overlaps the bank insulating layer. The optical element is disposed on the touch structure. The optical element includes a first lens that overlaps the first emission region of the device substrate. The color filter overlaps the first emission region of the device substrate. The color filter is disposed on the optical element.

In one embodiment, a display apparatus comprises: a first light-emitting device overlapping a first emission region of a device substrate; an encapsulating element on the device substrate, the encapsulating element covering the first light-emitting device; a touch electrode disposed on the encapsulating element without overlapping the first emission region; a first color filter disposed on the encapsulating element, the first color filter overlapping with the first emission region; and a first lens between the encapsulating element and the first color filter.

In one embodiment, a display apparatus comprises: a device substrate including a first emission region; a light-emitting device that emits light, the light-emitting device overlapping the first emission region; a touch structure on the light-emitting device, the touch structure non-overlapping with the first emission region but overlapping a non-emission region that is horizontally adjacent to the first emission region; an optical element on the touch structure, the optical element including a first lens that overlaps the first emission region; and a color filter on the optical element, the color filter overlapping the first emission region.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
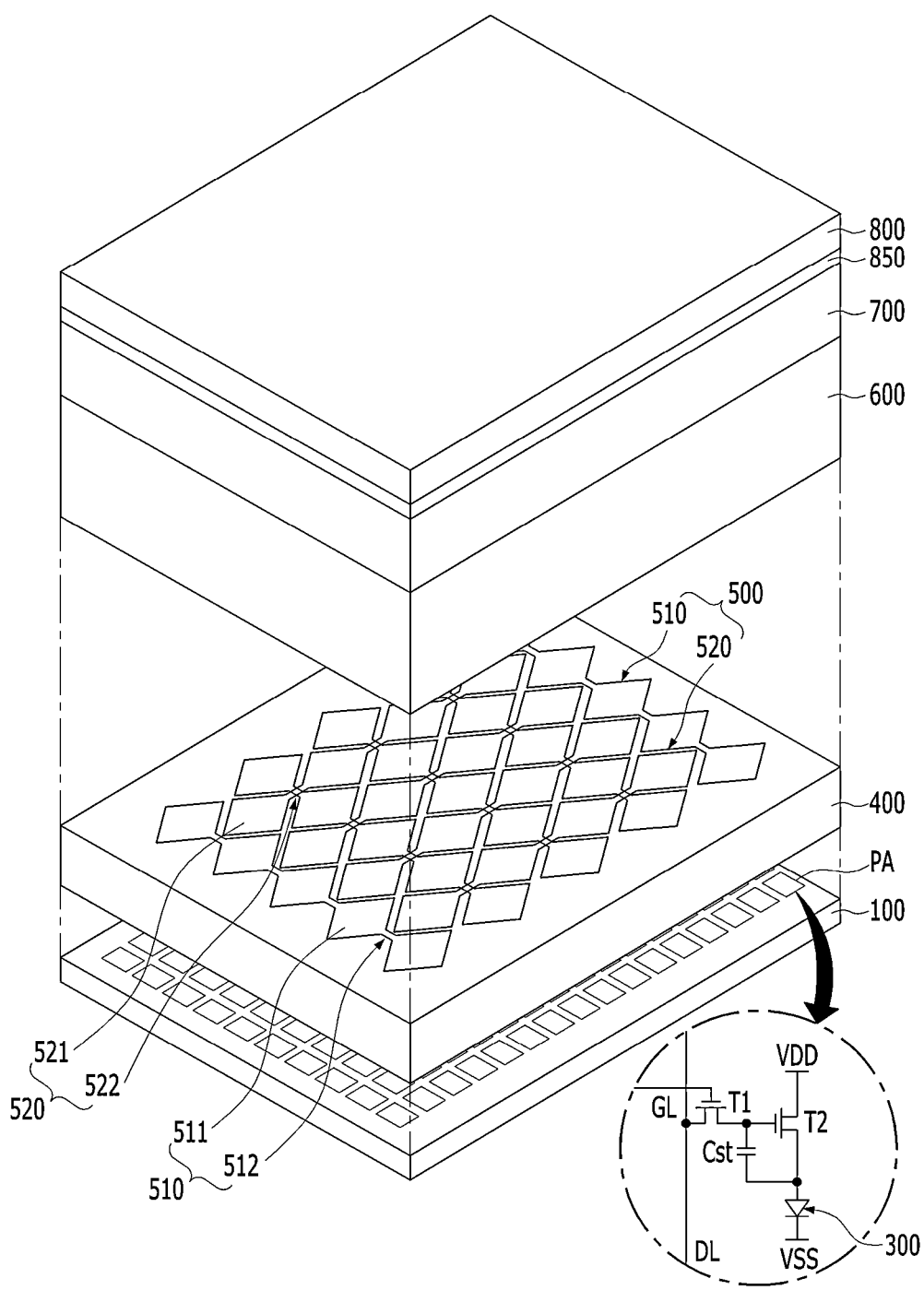
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical spirit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical spirit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
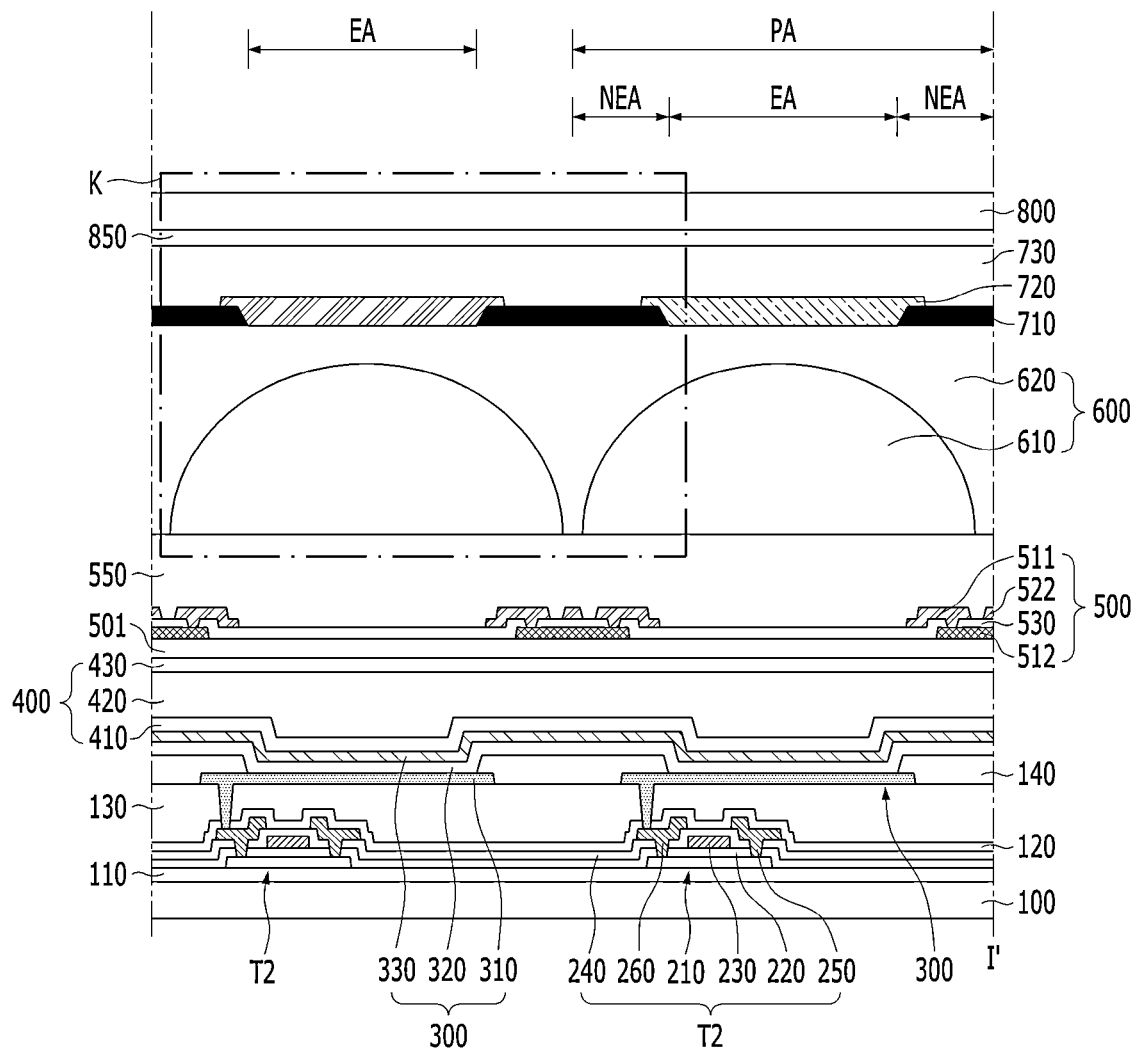
FIG. 2 is a view showing a cross-section of a pixel area in the display apparatus according to the embodiment of the present disclosure.
Figure 3:
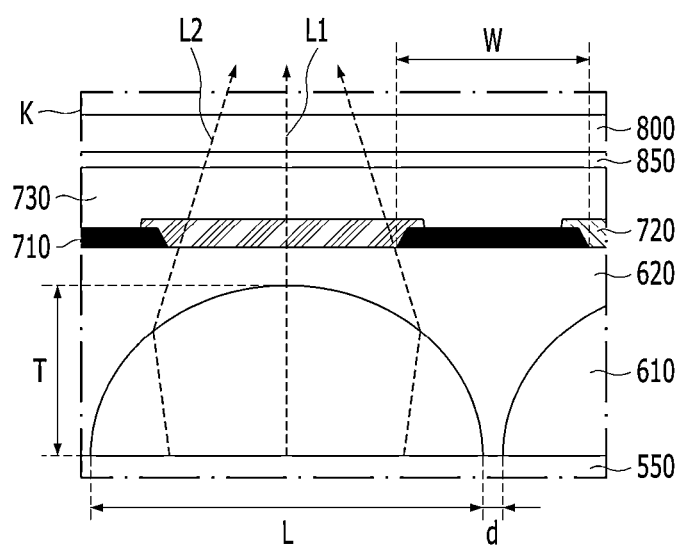
FIG. 3 is an enlarged view of K region in FIG. 2 according to the embodiment of the present disclosure.

FIG. 1 is a view schematically showing a display apparatus according to an embodiment of the present disclosure. FIG. 2 is a view showing a cross-section of a pixel area in the display apparatus according to the embodiment of the present disclosure. FIG. 3 is an enlarged view of K region in FIG. 2 according to an embodiment of the present disclosure.

Referring to FIGS. 1 to 3, the display apparatus according to embodiment of the present disclosure may include a device substrate 100. The device substrate 100 may include an insulating material. For example, the device substrate 100 may include glass or plastic.

Signal wires GL, DL, VDD and VSS may be disposed on the device substrate 100. The signal wires GL, DL, VDD and VSS may transmit various signals to realize an image. For example, the signal wires GL, DL, VDD and VSS may include a gate line GL applying a gate signal, a data line DL applying a data signal, and a power voltage supply line VDD and VSS supplying a power voltage.

Pixel areas PA may be disposed among the signal wires GL, DL, VDD and VSS. Each of the pixel areas PA may include a driving circuit and a light-emitting device 300. The driving circuit of each pixel area PA may be electrically connected to the signal wires GL, DL, VDD and VSS. For example, the driving circuit of each pixel area PA may generate a driving current corresponding to the data signal according to the gate signal. For example, the driving circuit of each pixel area PA may include a first thin film transistor T1, a second thin film transistor T2 and a storage capacitor Cst.

The first thin film transistor T1 may transmit the data signal to the second thin film transistor T2 according to the gate signal. The second thin film transistor T2 may generate the driving current corresponding to the data signal which is transmitted from the first thin film transistor T1. For example, the second thin film transistor T2 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous-Si or poly-Si. The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a resistance lower than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having high dielectric constant. For example, the gate insulating layer 220 may include a High-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) or tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 within the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) or tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 within the drain contact hole.

The first thin film transistor T1 may have a stacked structure same as the second thin film transistor T2. For example, the first thin film transistor T1 may include a gate electrode electrically connected to the gate line GL and a source electrode electrically connected to the date line DL. The gate electrode 230 of the second thin film transistor T2 may be electrically connected to a drain electrode of the first thin film transistor T1. A semiconductor pattern of the first thin film transistor T1 may include the same material as the semiconductor pattern 210 of the second thin film transistor T2.

The storage capacitor Cst may maintain the operation of the second thin film transistor T2 during one frame. For example, the storage capacitor Cst may be connected between the gate electrode 230 and the drain electrode 260 of the second thin film transistor T2.

A device buffer layer 110 may be disposed between the device substrate 100 and the driving circuit of each pixel area PA. The device buffer layer 110 may prevent or at least reduce pollution due to the device substrate 100 in a process of forming the driving circuits. For example, a surface of the device substrate 100 toward the driving circuit of each pixel area PA may be completely covered by the device buffer layer 110. The device buffer layer 110 may include an insulating material. For example, the device buffer layer 110 may include silicon oxide (SiO) and/or silicon nitride (SiN). The device buffer layer 110 may have a multi-layer structure.

A lower passivation layer 120 may be disposed on the driving circuit of each pixel area PA. The lower passivation layer 120 may prevent or at least reduce the damage of the driving circuit of each pixel area PA due to external impact and moisture. For example, the first thin film transistor T1, the second thin film transistor T2 and the storage capacitor Cst of each pixel area PA may be completely covered by the lower passivation layer 120. The lower passivation layer 120 may include an insulating material. For example, the lower passivation layer 120 may include silicon oxide (SiO) and/or silicon nitride (SiN).

An over-coat layer 130 may be disposed on the lower passivation layer 120. The over-coat layer 130 may remove a thickness difference due to the driving circuit of each pixel area PA. For example, a surface of the over-coat layer 130 opposite to the device substrate 100 may be a flat surface. The over-coat layer 130 may include an insulating material. The over-coat layer 130 may include a material different from the lower passivation layer 120. For example, the over-coat layer 130 may include an organic insulating material.

The light-emitting device 300 of each pixel area PA may be disposed on the over-coat layer 130. The light-emitting device 300 may emit light displaying a specific color. For example, the light-emitting device 300 may include a first emission electrode 310, a light-emitting layer 320 and a second emission electrode 330, which are sequentially stacked on the over-coat layer 130.

The first emission electrode 310 may include a conductive material. The first emission electrode 310 may include a material having high reflectance. For example, the first emission electrode 310 may include a metal, such as aluminum (Al) or silver (Ag). The first emission electrode 310 may have a multi-layer structure. For example, the first emission electrode 310 may have a structure in which a reflective electrode formed of a metal is disposed between transparent electrodes formed of a transparent conductive material, such as ITO and IZO.

The light-emitting layer 320 may generate light having luminance corresponding to a voltage difference between the first emission electrode 310 and the second emission electrode 330. For example, the light-emitting layer 320 may include an emission material layer (EML) having an emission material. The emission material may include an organic material, an inorganic material or a hydride material. For example, the display apparatus according to the embodiment of the present disclosure may be an organic light-emitting display apparatus including the light-emitting layer 320 formed of an organic material. The light-emitting layer 320 may have a multi-layer structure. For example, the light-emitting layer 320 may further include at least one of a hole injection layer (HIL), a hole transmitting layer (HTL), an electron transmitting layer (ETL) and an electron injection layer (EIL). Thus, in the display apparatus according to the embodiment of the present disclosure, the luminous efficiency may be improved.

The second emission electrode 330 may include a conductive material. The second emission electrode 330 may include a material different from the first emission electrode 310. The transparency of the second emission electrode 330 may be higher than the transparency of the first emission electrode 310. For example, the second emission electrode 330 may be a transparent electrode consisting of a transparent conductive material, such as ITO and IZO. Thus, in the display apparatus according to the embodiment of the present disclosure, the light generated by the light-emitting layer 320 of each pixel area PA may be emitted to the outside through the second emission electrode 330 of the corresponding pixel area PA.

The light-emitting device 300 of each pixel area PA may be electrically connected to the driving circuit of the corresponding pixel area PA. For example, the first emission electrode 310 of the light-emitting device 300 in each pixel area PA may be electrically connected to the drain electrode 260 of the second thin film transistor T2 in the corresponding pixel area PA. The lower passivation layer 120 and the over-coat layer 130 may include electrode contact holes partially exposing the drain electrode 260 of the second thin film transistor T2 in each pixel area PA. The first emission electrode 310 in each pixel area PA may include a portion overlapping with the drain electrode 260 of the second thin film transistor T2 in the corresponding pixel area PA. For example, the first emission electrode 310 in each pixel area PA may be in direct contact with the drain electrode 260 of the second thin film transistor T2 in the corresponding pixel area PA through one of the electrode contact holes.

A bank insulating layer 140 may be disposed on the over-coat layer 130. The bank insulating layer 140 may include an insulating material. For example, the bank insulating layer 140 may include an organic insulating material. The bank insulating layer 140 may include a material different from the over-coat layer 130. The bank insulating layer 140 may include a light absorbing material. For example, the bank insulating layer 140 may include a black dye. Thus, in the display apparatus according to the embodiment of the present disclosure, the reflection of the external light may be reduced. The bank insulating layer 140 may define an emission region EA in each pixel area PA. For example, an edge of the first emission electrode 310 in each pixel area PA may be covered by the bank insulating layer 140. The light-emitting layer 320 and the second emission electrode 330 in each pixel area PA may be stacked on a portion of the first emission electrode 310 exposed by the bank insulating layer 140 in the corresponding pixel area PA. For example, the bank insulating layer 140 may overlap a non-emission region NEA of each pixel area PA. Therefore, in the display apparatus according to the embodiment of the present disclosure, the light-emitting device 300 of each pixel area PA may be controlled, independently.

The light-emitting layer 320 in each pixel area PA may extend on the bank insulating layer 140. The light-emitting device 300 in each pixel area PA may emit the light having the same wavelength as the light-emitting device 300 in adjacent pixel area PA. For example, the light-emitting layer 320 in each pixel area PA may be coupled with the light-emitting layer 320 in adjacent pixel area PA. Thus, in the display apparatus according to the embodiment of the present disclosure, a process of forming the light-emitting layer 320 may be simplified.

The second emission electrode 330 in each pixel area PA may extend on the bank insulating layer 140. For example, a voltage applied to the second emission electrode 330 in each pixel area PA may the same as a voltage applied to the second emission electrode 330 in adjacent pixel area PA. For example, the second emission electrode 330 in each pixel area PA may be electrically connected to the second emission electrode 330 in adjacent pixel area PA. Thus, in the display apparatus according to the embodiment of the present disclosure, the luminance of each pixel area PA may be controlled by the data signal. The second emission electrode 330 in each pixel area PA may be in direct contact with the second emission electrode 330 in adjacent pixel area PA. For example, the second emission electrode 330 in each pixel area PA may include the same material as the second emission electrode 330 in adjacent pixel area PA. Therefore, in the display apparatus according to the embodiment of the present disclosure, a process of forming the second emission electrode 330 may be simplified.

An encapsulating element 400 may be disposed on the light-emitting device 300 of each pixel area PA. The encapsulating element 400 may prevent or at least reduce the damage of the light-emitting devices 300 due to the external impact and moisture. The encapsulating element 400 may extend beyond each pixel area PA. For example, the driving circuit and the light-emitting device 300 of each pixel area PA may be completely covered by the encapsulating element 400.

The encapsulating element 400 may have a multi-layer structure. For example, the encapsulating element 400 may include a first encapsulating layer 410, a second encapsulating layer 420 and a third encapsulating layer 430, which are sequentially stacked on the device substrate 100. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the display apparatus according to the embodiment of the present disclosure, the damage of the light-emitting device 300 due to the external impact and moisture may be effectively prevented. A thickness difference due to the light-emitting device 300 of each pixel area PA may be removed by the second encapsulating layer 420. For example, a surface of the encapsulating element 400 opposite to the device substrate 100 may be a flat surface.

A touch structure 500 may be disposed on the encapsulating element 400. The touch structure 500 may detect a touch of a user and/or a tool. For example, the touch structure 500 may include touch electrodes 511 and 521, which are disposed side by side, and bridge electrodes 512 and 522 electrically connecting between the touch electrodes 511 and 521. A touch buffer layer 501 may be disposed between the encapsulating element 400 and the touch structure 500. The touch buffer layer 501 may prevent or at least reduce the damage of the light-emitting device 300 in a process of forming the touch electrodes 511 and 521 and the bridge electrodes 512 and 522. For example, a surface of the encapsulating element 400 toward the touch structure 500 may be completely covered by the touch buffer layer 501. The touch buffer layer 501 may include an insulating material. For example, the touch buffer layer 501 may include silicon oxide (SiO) and/or silicon nitride (SiN).

The touch electrodes 511 and 521 and the bridge electrodes 512 and 522 may include a conductive material. The touch electrodes 511 and 521 and the bridge electrodes 512 and 522 may include a material having low resistance. For example, the touch electrodes 511 and 521 and the bridge electrode 512 and 522 may include a metal, such as aluminum (Al), copper (Cu), titanium (Ti), molybdenum (Mo) or tungsten (W). The touch electrodes 511 and 521 and the bridge electrodes 512 and 522 may have a high reflectance. For example, the light emitted toward the touch electrodes 511 and 521 or the bridge electrodes 512 and 522 from the light-emitting device 300 of each pixel area PA may be blocked by the touch electrodes 511 and 521 and the bridge electrodes 512 and 522.

The touch electrodes 511 and 521 and the bridge electrodes 512 and 522 may be spaced away from the light-emitting device 300 of each pixel area PA. For example, the touch electrodes 511 and 521 and the bridge electrodes 512 and 522 may be disposed on the non-emission region NEA of each pixel area PA. The touch electrodes 511 and 521 and the bridge electrodes 512 and 522 may overlap the bank insulating layer 140. The light emitted from the light-emitting device 300 of each pixel area PA may pass between the touch electrodes 511 and 521 and the bridge electrodes 512 and 522. That is, in the display apparatus according to the embodiment of the present disclosure, the travelling direction of the light emitted from each light-emitting device 300 may be restricted by the touch electrodes 511 and 521 and the bridge electrodes 512 and 522. Thus, the display apparatus according to the embodiment of the present disclosure may realize a narrow viewing angle using the touch structure 500.

The touch structure 500 may include a first touch assembly 510 in which the touch electrodes 511 and 521 are connected in a first direction, and a second touch assembly 520 in which the touch electrodes 511 and 521 are connected to a second direction perpendicular to the first direction. For example, the first touch assembly 510 may include first touch electrodes 511 disposed side by side and first bridge electrodes 512 connecting the first touch electrodes 511 in the first direction, and the second touch assembly 520 may include second touch electrodes 521 disposed among the first touch electrodes 511 and second bridge electrodes 522 connecting the second touch electrodes 521 in the second direction. Each of the second bridge electrodes 522 may cross one of the first bridge electrodes 512. The second bridge electrodes 522 may be insulated from the first bridge electrodes 512. The second bridge electrodes 522 may be disposed on a layer different from the first bridge electrodes 512. For example, a touch insulating layer 530 may be disposed between the first bridge electrodes 512 and the second bridge electrodes 522. The touch insulating layer 530 may include an insulating material. For example, the touch insulating layer 530 may include an inorganic insulating material, such as silicon oxide (SiO) and silicon nitride (SiN).

The second touch electrodes 521 may be disposed on the same layer as the first touch electrodes 511. For example, the touch insulating layer 530 may cover the first bridge electrodes 512, and the first touch electrodes 511, the second touch electrodes 521 and the second bridge electrodes 522 may be disposed on the touch insulating layer 530. The touch insulating layer 530 may include touch contact holes partially exposing each first bridge electrode 512. Each of the first touch electrodes 511 may be connected to the corresponding first bridge electrode 512 through one of the touch contact holes.

A touch planarization layer 550 may be disposed on the touch structure 500. The touch planarization layer 550 may prevent or at least reduce the damage of the touch structure 500 due to the external impact and moisture. For example, the first touch electrodes 511, the second touch electrodes 521 and the second bridge electrodes 522 may be completely covered by the touch planarization layer 550. The touch planarization layer 550 may extend on the emission region EA of each pixel area PA. The touch planarization layer 550 may include an insulating material. For example, the touch planarization layer 550 may include an organic insulating material. A thickness difference due to the touch structure 500 may be removed by the touch planarization layer 550. For example, a surface of the touch planarization layer 550 opposite to the device substrate 100 may be a flat surface. The touch planarization layer 550 may include a transparent material. Thus, in the display apparatus according to the embodiment of the present disclosure, a decrease in the luminance due to the touch planarization layer 550 may be reduced.

Optical element 600 may be disposed on the touch planarization layer 550. The optical element 600 may be disposed on the emission region EA and the non-emission region NEA of each pixel area PA. For example, the optical element 600 may include lenses 610 on the emission region EA of each pixel area PA and a lens passivation layer 620 covering the lenses 610.

Each of the lenses 610 may be disposed on a path of the light emitted from the light-emitting device 300 of the corresponding pixel area PA. For example, a diameter L of each lens 610 may be greater than a horizontal width of the emission region EA defined in the corresponding pixel area PA. An edge of each lens 610 may be disposed on the non-emission area NEA of the corresponding pixel area PA. Thus, in the display apparatus according to the embodiment of the present disclosure, all light of each pixel area PA in which the travelling direction is restricted by the touch structure 500 may pass through the lens 610 in the corresponding pixel area PA.

The lens passivation layer 620 may be disposed on the lenses 610. The lens passivation layer 620 may prevent or at least reduce the damage of the lenses 610 due to the external impact. The lens passivation layer 620 may include an insulating material. For example, the lens passivation layer 620 may include an organic insulating material. A thickness difference due to the lenses 610 may be removed by the lens passivation layer 620. For example, a surface of the lens passivation layer 620 opposite to the device substrate 100 may be a flat surface. For example, a refractive index of the lens passivation layer 620 may be less than a refractive index of each lens 610. Thus, in the display apparatus according to the embodiment of the present disclosure, the light L1 emitted in a direction perpendicular to a surface of the device substrate 100 in the emission region EA of each pixel area PA may pass through the optical element 600 as it is, and the light L2 emitted in an oblique direction may be refracted in an inner direction of the corresponding pixel area PA. That is, in the display apparatus according to the embodiment of the present disclosure, the light passing between the touch electrodes 511 and 521 may be focused by the optical element 600. Therefore, in the display apparatus according to the embodiment of the present disclosure, the narrow viewing angle may be effectively realized, and the frontal luminance of each pixel area PA may be improved.

A black matrix 710 and color filters 720 may be disposed on the optical element 600. The black matrix 710 may be disposed on the non-emission region NEA of each pixel area PA. For example, a horizontal width W of the black matrix 710 may be the same as a horizontal width of the bank insulating layer 140. The touch structure 500 may be disposed between the bank insulating layer 140 and the black matrix 710. For example, the touch electrodes 511 and 521 and the bridge electrodes 512 and 522 may overlap the black matrix 710. Thus, in the display apparatus according to the embodiment of the present disclosure, visibility degradation due to the touch structure 500 may be prevented. The color filters 720 may be disposed on the emission region EA of each pixel area PA. For example, the emission region EA of each pixel area PA may overlap one of the color filters 720. The color filters 720 may be disposed side by side with the black matrix 710. For example, a surface of the black matrix 710 toward the device substrate 100 and a surface of each color filter 720 may be in direct contact with the lens passivation layer 620. An end of each color filter 720 may overlap the black matrix 710. Therefore, in the display apparatus according to the embodiment of the present disclosure, a light leakage phenomenon in which the light that has not passed through the color filters 720 is emitted may be prevented or at least reduced.

The color filter 720 on the emission region EA of each pixel area PA may include a material different from the color filter 720 on the emission region EA of adjacent pixel area PA. Thus, in the display apparatus according to the embodiment of the present disclosure, each of the pixel area PA may realize a color different from adjacent pixel area PA. Therefore, in the display apparatus according to the embodiment of the present disclosure, the image made of various colors may be provided to the user.

The light focused by each lens 610 may be emitted through the corresponding color filter 720 on the emission region EA of the corresponding pixel area PA. Each of the color filter 720 may have a horizontal width that is the same as the emission region EA of the corresponding pixel area PA. For example, a horizontal width of each color filter 720 may be less than a diameter L of the corresponding lens 610. Thus, in the display apparatus according to the embodiment of the present disclosure, the reflection of the external light may be reduced, and the narrow viewing angle may be realized.

An upper planarization layer 730 may be disposed on the black matrix 710 and the color filters 720. The upper planarization layer 730 may prevent the damage of the black matrix 710 and the color filters 720 due to the external impact. For example, the upper planarization layer 730 may completely cover the black matrix 710 and the color filters 720. The upper planarization layer 730 may include an insulating material. For example, the upper planarization layer 730 may include an organic insulating material. A thickness difference due to the black matrix 710 and the color filters 720 may be removed by the upper planarization layer 730.

A cover substrate 800 may be disposed on the upper planarization layer 730. The cover substrate 800 may mitigate the external impact and block the penetration of the external moisture. The cover substrate 800 may include a transparent material. For example, the cover substrate 800 may include glass and plastic. The cover substrate 800 may be attached to the upper planarization layer 730. For example, a cover adhesive layer 850 may be disposed between the upper planarization layer 730 and the cover substrate 800. The cover adhesive layer 850 may include an adhesive material. The cover adhesive layer 850 may include a transparent material. For example, the cover adhesive layer 850 may include optical clear adhesive (OCA). The cover adhesive layer 850 may reduce the reflection of the external light. For example, the cover adhesive layer 850 may have a transmittance of about 90%.

Accordingly, the display apparatus according to the embodiment of the present disclosure may include the light-emitting device 300, the touch structure 500, the lens 610 and the color filter 720, which are sequentially stacked on each pixel area PA of the device substrate 100. Thus, in the display apparatus according to the embodiment of the present disclosure, the light generated by the light-emitting device 300 of each pixel area PA may be focused by the lens 610 on the corresponding pixel area PA after passing between the touch electrodes 511 and 521, so that the light may be emitted to the outside through the color filter 720 on the emission region EA of the corresponding pixel area PA.

Figure 4:
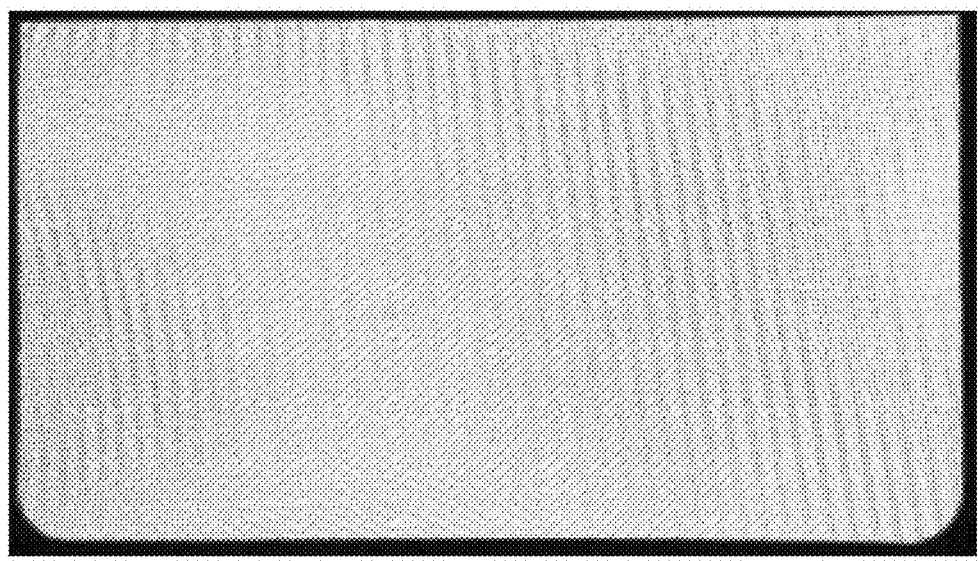
FIGS. 4 and 5 are images for explaining the quality difference according to the presence or absence of a color filter.
Figure 5:
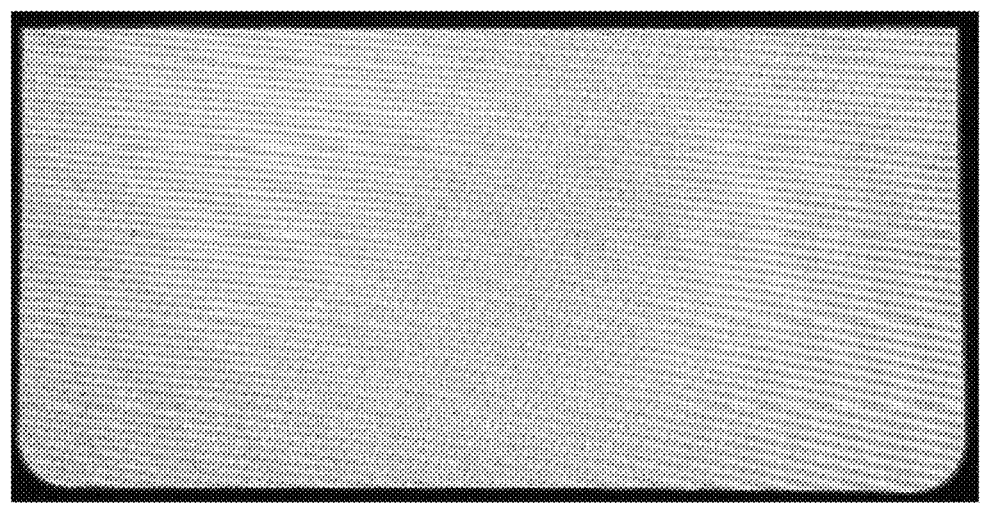

FIG. 4 is an image by a display apparatus in which the color filters 720 are not disposed on the lenses 610. FIG. 5 is an image by the display apparatus according to the embodiment of the present disclosure. As shown in FIG. 4, in the display apparatus in which the color filters 720 are not disposed, a moire phenomenon in which a pattern in a vertical direction is repeated occurs by the touch structure 500 and the lenses 610 on each pixel area PA. However, as shown in FIG. 5, in the display apparatus according to the embodiment of the present disclosure, the repeat pattern in a vertical direction is not visible. That is, in the display apparatus according to the embodiment of the present disclosure, the moire phenomenon due to the repeat arrangement of the touch structure 500 and the lenses 610 may be prevented by the color filters 720. Therefore, in the display apparatus according to the embodiment of the present disclosure, the narrow viewing angle may be effectively realized, the frontal luminance of each pixel area PA may be improved, and the quality of the image provided to the user may be improved.

Figure 6:
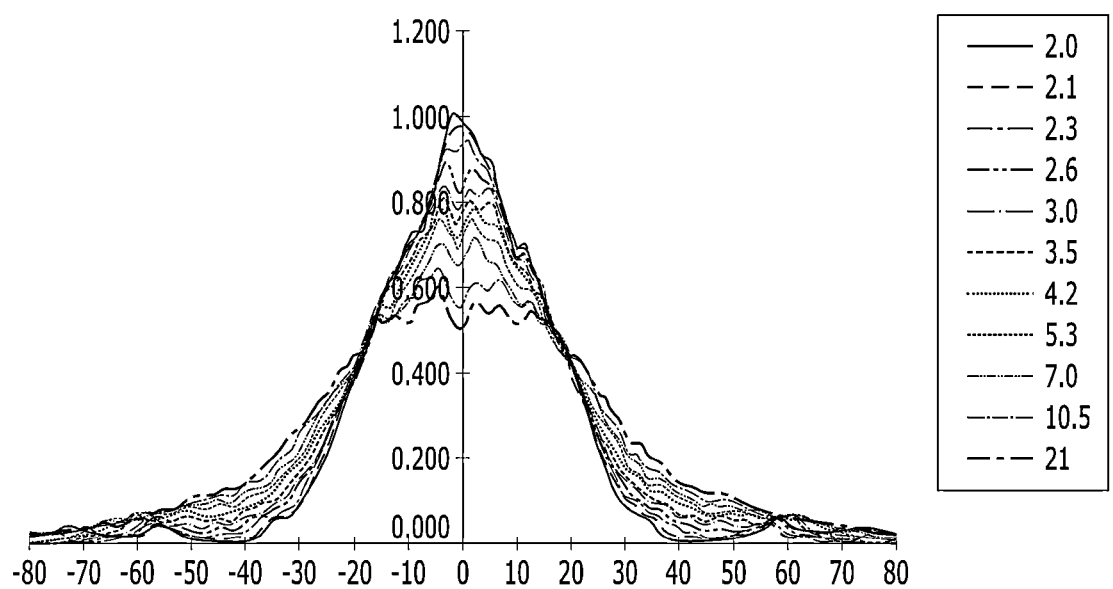
FIG. 6 is a graph showing the luminance distribution according to the aspect ratio of the lens on the emission region of each pixel area.

FIG. 6 is a graph showing the luminance distribution according to the aspect ratio of the lens on the emission region of each pixel area. Table 1 is a table showing the viewing angle according to the aspect ratio of the lens 610 on the emission region EA of each pixel area PA in the display apparatus according to the embodiment of the present disclosure. Herein, the aspect ratio of each lens 610 may mean a ratio L/T of a diameter L and a thickness T of the corresponding lens 610.

TABLE 1

| aspect ratio of lens (L/T) | | | | |
|---|---|---|---|---|
| 2.0 | 2.1 | 2.3 | 2.6 | 3.0 |
| viewing angle −29~+29 | −30~+30 | −31~+32 | −33~+34 | −36~+37 |
| aspect ratio of lens (L/T) | | | | |
| 3.5 | 4.2 | 5.3 | 7.0 | 10.5 |
| viewing angle −39~+39 | −42~+42 | −52~+52 | −53~+53 | −58~+59 |

Referring FIG. 6 and Table 1, in the display apparatus according to the embodiment of the present disclosure, when the aspect ratio of the lens 610 on each pixel area PA is 5.3 or more, the viewing angle may increase rapidly. Thus, in the display apparatus according to the embodiment of the present disclosure, the lens 610 on each pixel area PA may have the aspect ratio of 4.2 or less. Therefore, in the display apparatus according to the embodiment of the present disclosure, the narrow viewing angle may be effectively realized.

Figure 7:
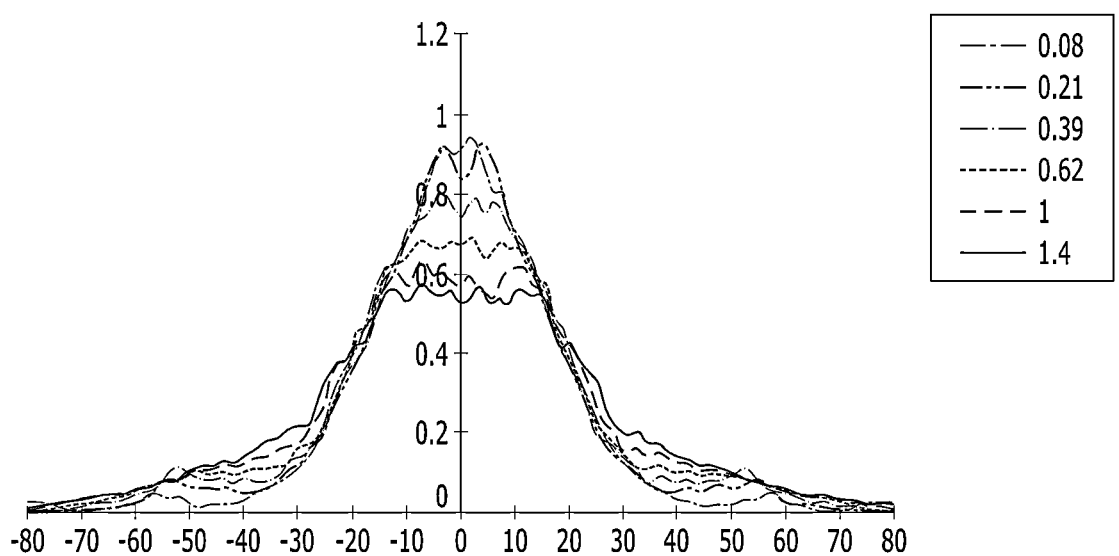
FIG. 7 is a graph showing the luminance distribution according to the ratio between the diameter of each lens and the distance between the lenses which are disposed on adjacent pixel areas in the display apparatus according to the embodiment of the present disclosure.

In the display apparatus according to the embodiment of the present disclosure, the emission region EA of each pixel area PA may have the same horizontal width. For example, in the display apparatus according to the embodiment of the present disclosure, a diameter L of the lens 610 in each pixel area PA may be the same. FIG. 7 is a graph showing the luminance distribution according to the ratio d/L between the diameter L of each lens 610 and the distance d between the lenses 610 which are disposed on adjacent pixel areas PA in the display apparatus according to the embodiment of the present disclosure. Table 2 is a table showing the viewing angle according to the ratio d/L between the diameter L of each lens 610 and the distance d between the lenses 610 which are disposed on adjacent pixel areas PA in the display apparatus according to the embodiment of the present disclosure.

TABLE 2

| ratio (d/L) | 0.08 | 0.21 | 0.39 | 0.62 | 1 | 1.4 |
|---|---|---|---|---|---|---|
| viewing angle | −31~+32 | −34~+34 | −56~+56 | −59~+59 | −60~+60 | −61~+61 |

Referring FIG. 7 and Table 2, in the display apparatus according to the embodiment of the present disclosure, when the ratio d/L of the diameter L of each lens 610 and the distance d between the lenses 610 which are disposed on adjacent pixel areas PA is 0.39 or more, the frontal luminance may rapidly decrease and the viewing angle may rapidly increase. Thus, in the display apparatus according to the embodiment of the present disclosure, the distance d between the lenses 610 which are disposed on adjacent pixel areas PA may be 0.21 times or less of the diameter L of each lens 610. Therefore, in the display apparatus according to the embodiment of the present disclosure, the narrow viewing angle may be effectively realized, and the frontal luminance of each pixel area PA may be improved.

Figure 8:
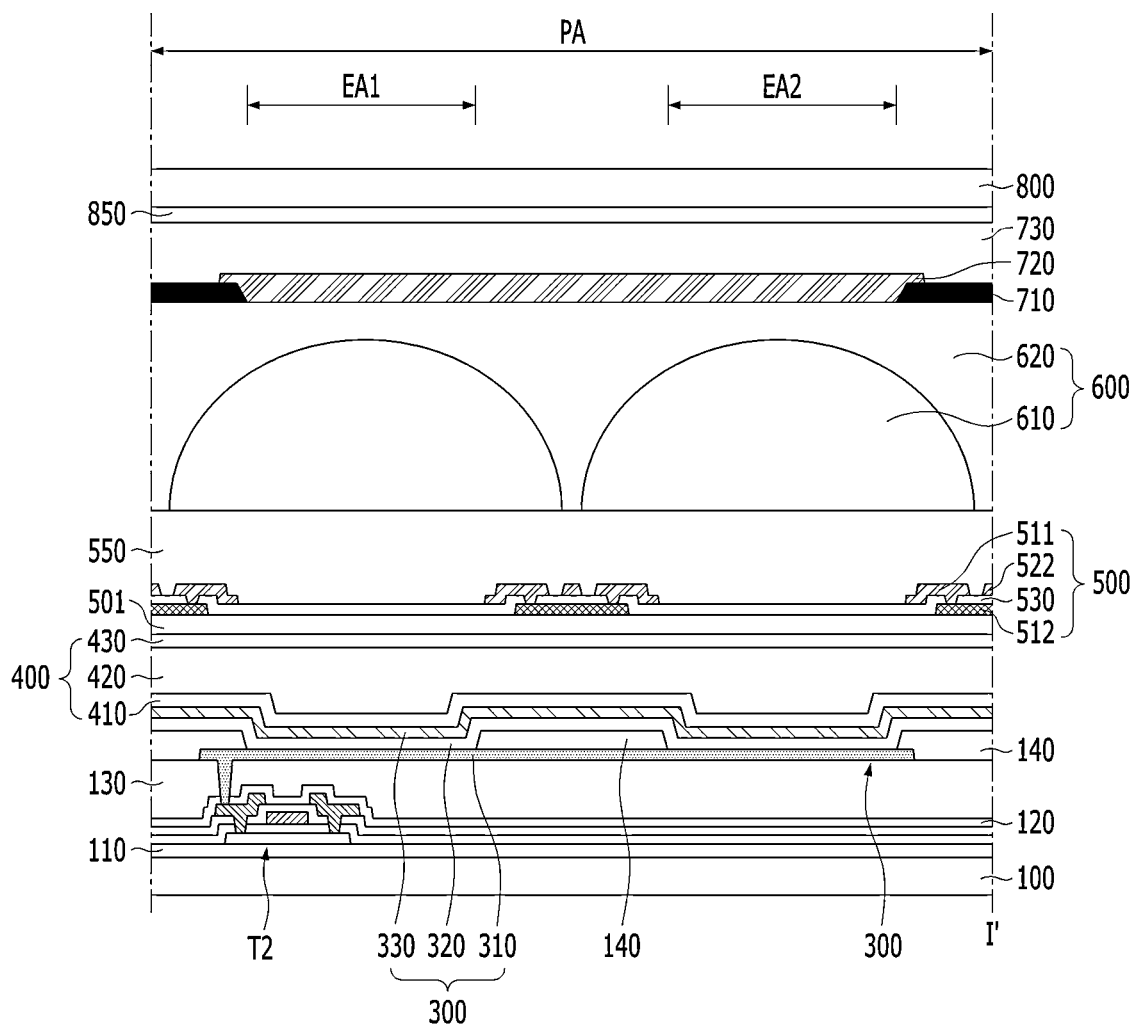
FIGS. 8 and 9 are views showing the display apparatus according another embodiment of the present disclosure.

The display apparatus according to the embodiment of the present disclosure is described that only one emission region EA is defined in each pixel area PA. However, in the display apparatus according to another embodiment of the present disclosure, a plurality of the emission regions EA may be defined in each pixel area PA. For example, in the display apparatus according to another embodiment of the present disclosure, a first emission region EA1 and a second emission region EA2 may be defined in each pixel area PA, as shown in FIG. 8. The light generated in the second emission region EA2 of each pixel area PA may display the same color as the light generated in the first emission region EA1 of the corresponding pixel area PA. For example, the light-emitting device 300 of each pixel area PA may include the first emission electrode 310, the light-emitting layer 320 and the second emission electrode 330, which are sequentially stacked on the first emission region EA1, and the first emission electrode 310, the light-emitting layer 320 and the second emission electrode 330 of each light-emitting device 300 may extend on the second emission region EA2 of the corresponding pixel area PA. The bank insulating layer 140 between the first emission region EA1 and the second emission region EA2 may be disposed between the first emission electrode 310 and the light-emitting layer 320. Each of the pixel area PA may realize a single color. For example, the color filter 720 on the first emission region EA1 of each pixel area PA may extend on the second emission region EA2 of the corresponding pixel area PA. The black matrix 710 may be not disposed between the first emission region EA1 and the second emission region EA2 of each pixel area PA. For example, the color filter 720 between the first emission region EA1 and the second emission region EA2 of each pixel area PA may be in direct contact with the lens passivation layer 620 of the optical element 600 and the upper planarization layer 730. That is, in the display apparatus according to another embodiment of the present disclosure, the emission regions EA1 and EA2 of each pixel area PA may be separated by the bank insulating layer 140. Therefore, in the display apparatus according to another embodiment of the present disclosure, the degree of freedom in the configuration of the pixel area PA may be improved.

Figure 9:
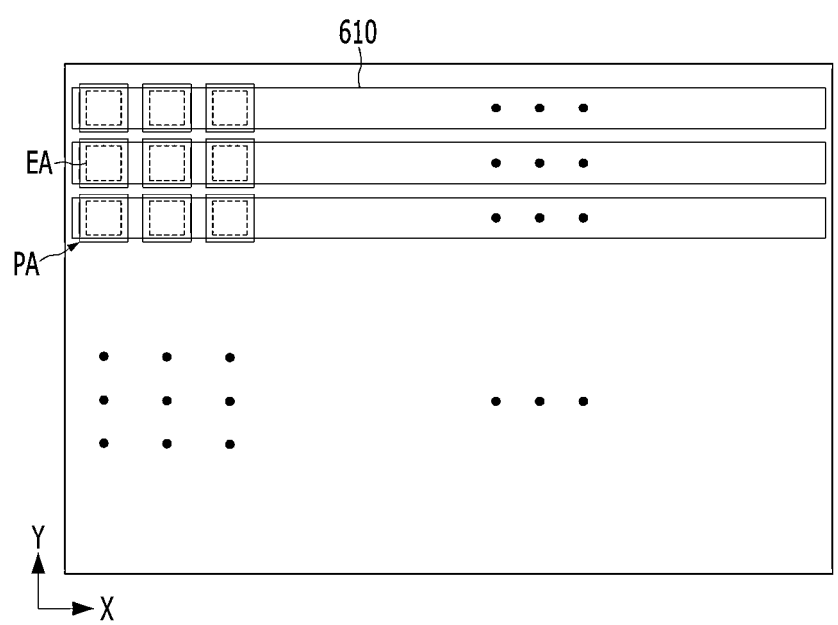

The display apparatus according to the embodiment of the present disclosure is described that the lens 610 in each pixel area PA is separated from the lens 610 in adjacent pixel area PA. However, in the display apparatus according to another embodiment of the present disclosure, the lenses 610 may extend in a direction. For example, in the display apparatus according to another embodiment of the present disclosure, the pixel areas PA may be arranged in a first direction X and a second direction Y perpendicular to the first direction X, the lenses 610 extending in the first direction X may be arranged in the second direction Y, side by side, as shown in FIG. 9. That is, in the display apparatus according to another embodiment of the present disclosure, each of the lenses 610 may extend on the emission regions EA of the pixel areas PA which are disposed in the first direction X. Thus, in the display apparatus according to another embodiment of the present disclosure, only light traveling in the second direction Y may be focused by the lenses 610. Therefore, the display apparatus according to another embodiment of the present disclosure may restrict the viewing angle of the second direction Y by the lenses 610 extending in the first direction X, and reduce the luminance difference in the first direction X.

In the result, the display apparatus according to the embodiments of the present disclosure may include the touch structure, the lenses and the color filters which are disposed on the encapsulating element covering the light-emitting devices, wherein the color filters may be disposed at the uppermost. Thus, the display apparatus according to the embodiments of the present disclosure may prevent the moire phenomenon and realize the narrow viewing angle, effectively. Therefore, in the display apparatus according to the embodiments of the present disclosure, the quality of the image may be improved.

What is claimed is:
1. A display apparatus comprising:
   a bank insulating layer on a device substrate, the bank insulating layer defining a first emission region of the device substrate;
   a light-emitting device including a first emission electrode, a light-emitting layer, and a second emission electrode that are sequentially stacked on the first emission region of the device substrate;
   an encapsulating element on the bank insulating layer and the light-emitting device;
   a touch structure on the encapsulating element, the touch structure including touch electrodes that overlap the bank insulating layer;
   a touch planarization layer on the touch structure, the touch planarization layer including a region that overlaps the first emission region;
   an optical element on the touch planarization layer, the optical element including a first lens that overlaps the first emission region and a lens passivation layer that covers the first lens; and a color filter on the lens passivation layer of the optical element, the color filter overlapping with the first emission region,
wherein a refractive index of the lens passivation layer is less than a refractive index of the first lens.

2. The display apparatus according to claim 1, wherein a diameter of the first lens is greater than a horizontal width of the first emission region.

3. The display apparatus according to claim 1, wherein a surface of the first lens opposite to the device substrate is in contact with the lens passivation layer.

4. The display apparatus according to claim 1, wherein the bank insulating layer includes a black dye.

5. The display apparatus according to claim 1, wherein the bank insulating layer defines a second emission region of the device substrate that is adjacent to the first emission region,
wherein the light-emitting device and the color filter extend to the second emission region,
wherein the optical element further includes a second lens that overlaps the second emission region, and
wherein the bank insulating layer between the first emission region and the second emission region is disposed between the first emission electrode and the light-emitting layer.

6. The display apparatus according to claim 5, further comprising:

a black-matrix disposed on the optical element, the black-matrix being spaced non-overlapping with the first emission region and the second emission region; and
an upper planarization layer covering the color filter and the black-matrix,
wherein the color filter between the first emission region and the second emission region is in contact with the optical element and the upper planarization layer.

7. The display apparatus according to claim 6, wherein the black-matrix overlaps the touch structure.

8. The display apparatus according to claim 7, wherein an end of the color filter overlaps with the black-matrix.

9. The display apparatus according to claim 5, wherein a diameter of the second lens is greater than a horizontal width of the second emission region.

10. The display apparatus according to claim 9, wherein the second emission region has a same horizontal width as the first emission region, and wherein a shape of the second lens is a same as a shape of the first lens.

11. The display apparatus according to claim 9, wherein a distance between the first lens and the second lens is equal to or less than 0.21 times of a diameter of the first lens.

12. The display apparatus according to claim 1, wherein an aspect ratio of the first lens is equal to or less than 4.2.

* * * * *